United States Patent
Yang et al.

(10) Patent No.: US 9,291,398 B2
(45) Date of Patent: Mar. 22, 2016

(54) MICRO VAPOR CHAMBER

(75) Inventors: Hsiu-Wei Yang, New Taipei (TW); Fu-Kuei Chang, New Taipei (TW)

(73) Assignee: Asia Vital Components Co., Ltd., New Taipei (TW)

( * ) Notice: Subject to any disclaimer, the term of this patent is extended or adjusted under 35 U.S.C. 154(b) by 585 days.

(21) Appl. No.: 13/045,534

(22) Filed: Mar. 11, 2011

(65) Prior Publication Data

US 2012/0186784 A1    Jul. 26, 2012

(30) Foreign Application Priority Data

Jan. 26, 2011  (TW) .................................. 100102802

(51) Int. Cl.
*F28D 15/04*     (2006.01)
*F28D 15/02*     (2006.01)
*H01L 23/427*    (2006.01)

(52) U.S. Cl.
CPC .......... *F28D 15/0266* (2013.01); *F28D 15/046* (2013.01); *H01L 23/427* (2013.01); *H01L 2924/0002* (2013.01)

(58) Field of Classification Search
USPC ................. 165/104.26, 104.33, 146; 361/700
See application file for complete search history.

(56) References Cited

U.S. PATENT DOCUMENTS

| 3,528,494 | A * | 9/1970 | Levedahl ................. | 165/104.26 |
| 6,880,626 | B2 * | 4/2005 | Lindemuth et al. ...... | 165/104.26 |
| 6,957,692 | B1 * | 10/2005 | Win-Haw et al. ........ | 165/104.33 |
| 7,044,201 | B2 * | 5/2006 | Cho et al. ................. | 165/104.26 |
| 7,246,655 | B2 * | 7/2007 | Mochizuki et al. ...... | 165/104.26 |
| 2009/0025910 | A1 * | 1/2009 | Hoffman et al. ......... | 165/104.26 |
| 2010/0132923 | A1 * | 6/2010 | Batty et al. ............... | 165/104.26 |

OTHER PUBLICATIONS

Kim et al., "Analytical and Experimental Investigation on the Operational Characteristics and the Thermal Optimization of a Miniature Heat Pipe with a Grooved Wick Structure", International Journal of Heat and Mass Transfer 46 (2003) pp. 2051-2063.*
Thomas et al., "Fully Developed Laminar Flow in Trapezoidal Grooves with Shear Stress at the Liquid-Vapor Interface", Ibid, vol. 44, Issue 18, Sep. 2001, pp. 3397-3412.*

* cited by examiner

*Primary Examiner* — Allen Flanigan
(74) *Attorney, Agent, or Firm* — C. G. Mersereau; Nikolai & Mersereau, P.A.

(57) ABSTRACT

A micro vapor chamber includes a first plate and a second plate. The first plate has a condensing region constituted of a plurality of protrusions. The second plate has a plurality of liquid-collecting regions and an evaporating region. The condensing region is located to correspond to the liquid-collecting regions and the evaporating region. The first plate is arranged to cover the second plate. The condensed working fluid are quickly collected on the protrusions to flow back to the evaporating region, thereby improving the liquid-vapor phase circulation of the working fluid in the micro vapor chamber greatly.

10 Claims, 7 Drawing Sheets

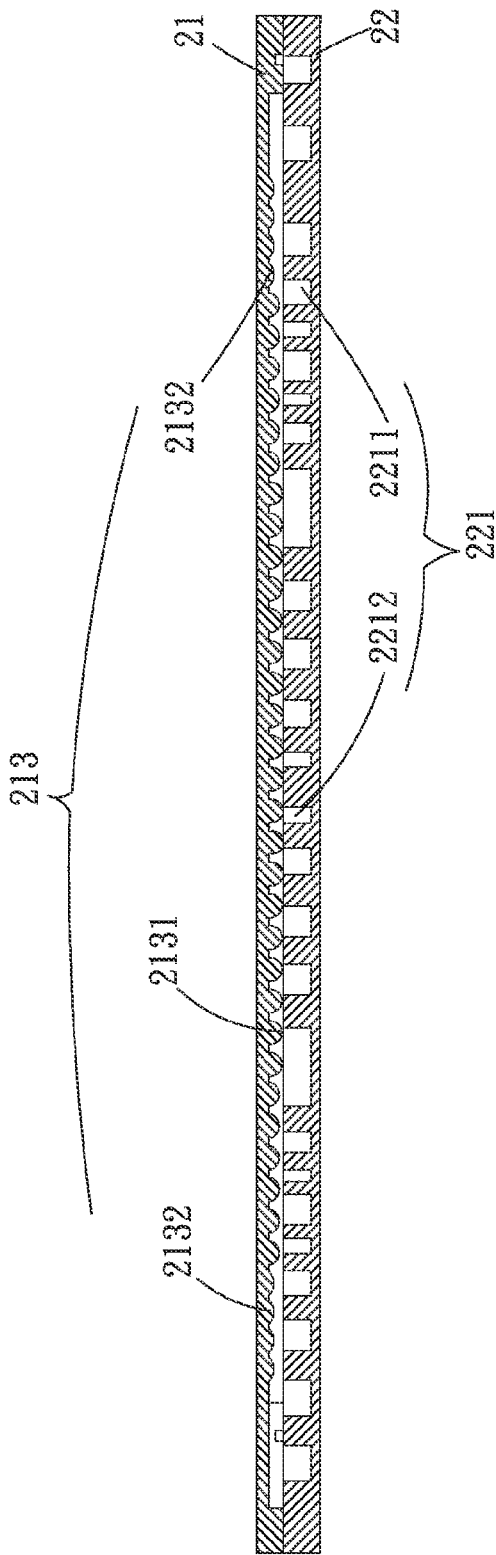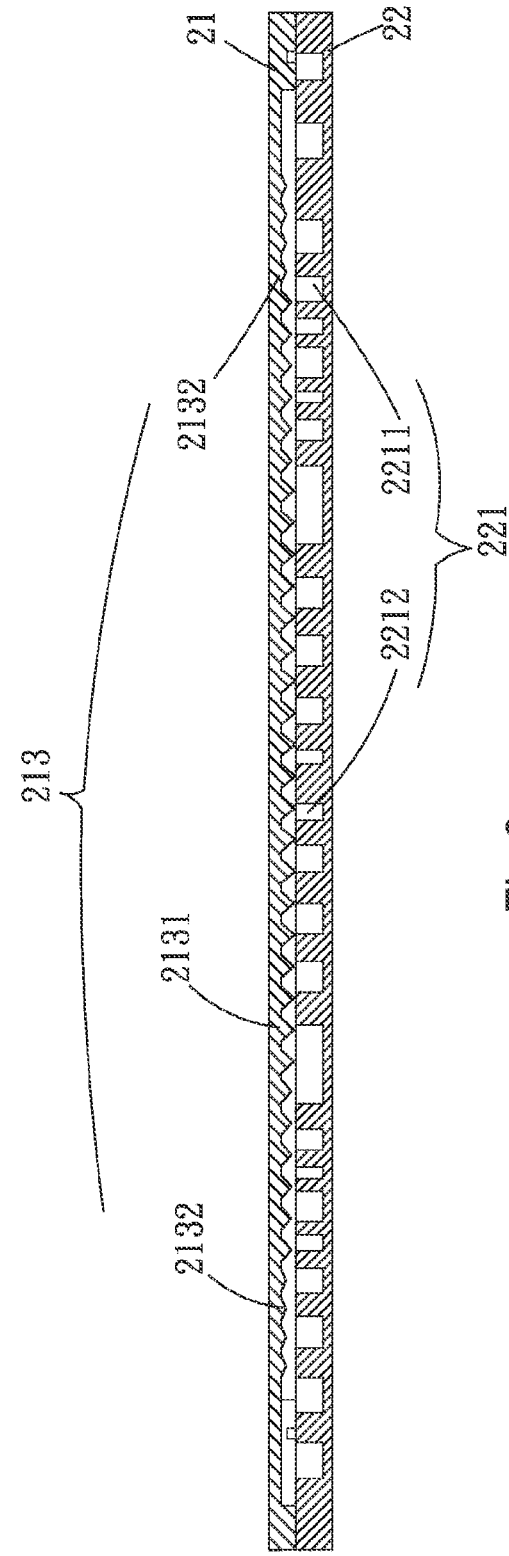

US 9,291,398 B2

MICRO VAPOR CHAMBER

This application claims the priority benefit of Taiwan patent application number 100102802 filed on Jan. 26, 2011.

BACKGROUND OF THE INVENTION

1. Field of the Invention

The present invention relates to a micro vapor chamber, and in particular to a micro vapor chamber in which a condensing region is provided with protrusions for allowing condensed working fluid to be quickly collected thereon so as to accelerate the flowing of the condensed working fluid back to an evaporating region. By this structure, the efficiency of liquid-vapor phase circulation of the working fluid in the micro vapor chamber is improved greatly.

2. Description of Prior Art

Currently, electronic apparatuses are gradually made to be more and more compact. Although the dimension of a semiconductor forming an electronic element is reduced, the performance of the semiconductor and the formed electronic element has to be increased. However, the increased performance of the electronic element inevitably generates more heat during its operation. Thus, it is an important issue to dissipate the heat generated by the electronic apparatus or system in order to improve its performance.

When the size of a semiconductor is reduced, its heat flux is increased. The increase in heat flux may cause a challenge to the cooling of an electronic product and make the electronic elements to be overheated at different times and locations. As a result, the electronic elements of the electronic product may suffer damage or break down.

Conventionally, in order to solve the problem of small space for heat dissipation, a vapor chamber is proposed, which is disposed above a chip (heat-generating element) as a heat sink. In order to increase the capillary force, a wick structure made of coated copper posts, sintered posts, foamed posts or the like is supported in the vapor chamber. Channels among these posts are used as reflow channels for allowing the working fluid condensed at a condensing region of the vapor chamber to flow back to an evaporating region of the vapor chamber. However, since the thickness of upper and lower walls of a micro vapor chamber is small (<1.5 mm), the portions of the above-mentioned micro vapor chamber in which no copper posts, sintered posts or foamed posts are supported may collapse or cave. As a result, the flatness and strength of the micro vapor chamber cannot be maintained in an ideal value, which makes the compact design of the micro vapor chamber difficult.

In the above-mentioned vapor chamber, the working fluid is heated in the evaporating region to evaporate, whereby the working fluid transforms from liquid phase into vapor phase. The vapor-phase working fluid is condensed in the condensing region, whereby the working fluid transforms from vapor phase into liquid phase and flows back to the evaporating region for circulation. The condensing region of the vapor chamber is usually formed into a smooth surface or a sintered wick structure, so that the droplets of the working fluid condensed in the condensing region can flow back to the evaporating region by means of gravity force or the capillary force generated by the wick structure. However, since the condensing region is formed into a smooth surface, the condensed droplet of the working fluid has to be collected to a volume large enough to drip down by gravity force. Thus, the reflow rate of the working fluid is insufficient. On the other hand, since the reflow rate of the working fluid is small, the working fluid may dry out in the evaporating region to greatly deteriorate the thermal-conducting efficiency of the whole vapor chamber. If the number or density of the wick structure (either made of sintered posts or meshes) is increased to improve the reflow rate of the working fluid, such a sintered or meshed wick structure will make the vapor chamber unable to be further compact.

Therefore, the conventional vapor chamber has the following problems:

(1) the reflow rate of the working fluid is too slow;
(2) its thermal-conducting efficiency is poor; and
(3) the compact design thereof is difficult.

SUMMARY OF THE INVENTION

In order to solve the above problems, the primary objective of the present invention is to provide a micro vapor chamber which can be made compact.

Another objective of the present invention is to provide a micro vapor chamber, in which liquid-vapor phase circulation of a working fluid is improved greatly.

In order to achieve the above objectives, the present invention is to provide a micro vapor chamber configured to cooperate with a heat source. The micro vapor chamber comprises a first plate and a second plate. The first plate has a first side surface and a second side surface. The first side surface has at least one condensing region. The condensing region has a plurality of protrusions. The second plate has a third side surface and a fourth side surface. The third side surface is located to cover the first side surface. The third side surface has a plurality of liquid-collecting regions and at least one evaporating region. The fourth side surface is adhered to the heat source.

By the protrusions of the condensing region, the vapor-phase working fluid can be quickly condensed in the condensing region and collected to form droplets to flow back to the liquid-collecting regions and the evaporating region. In this way, the liquid-vapor phase circulation of the working fluid in the micro vapor chamber can be improved greatly.

Therefore, the present invention has the following advantages:

(1) simple in structure;
(2) realizable compact design; and
(3) high thermal-conducting efficiency.

BRIEF DESCRIPTION OF THE DRAWINGS

FIG. 3 is an assembled cross-sectional view showing the first embodiment of the micro vapor chamber of the present invention;

FIG. 3a is an assembled cross-sectional view showing another aspect of the first embodiment of the micro vapor chamber of the present invention;

DETAILED DESCRIPTION OF THE INVENTION

Figure 1:
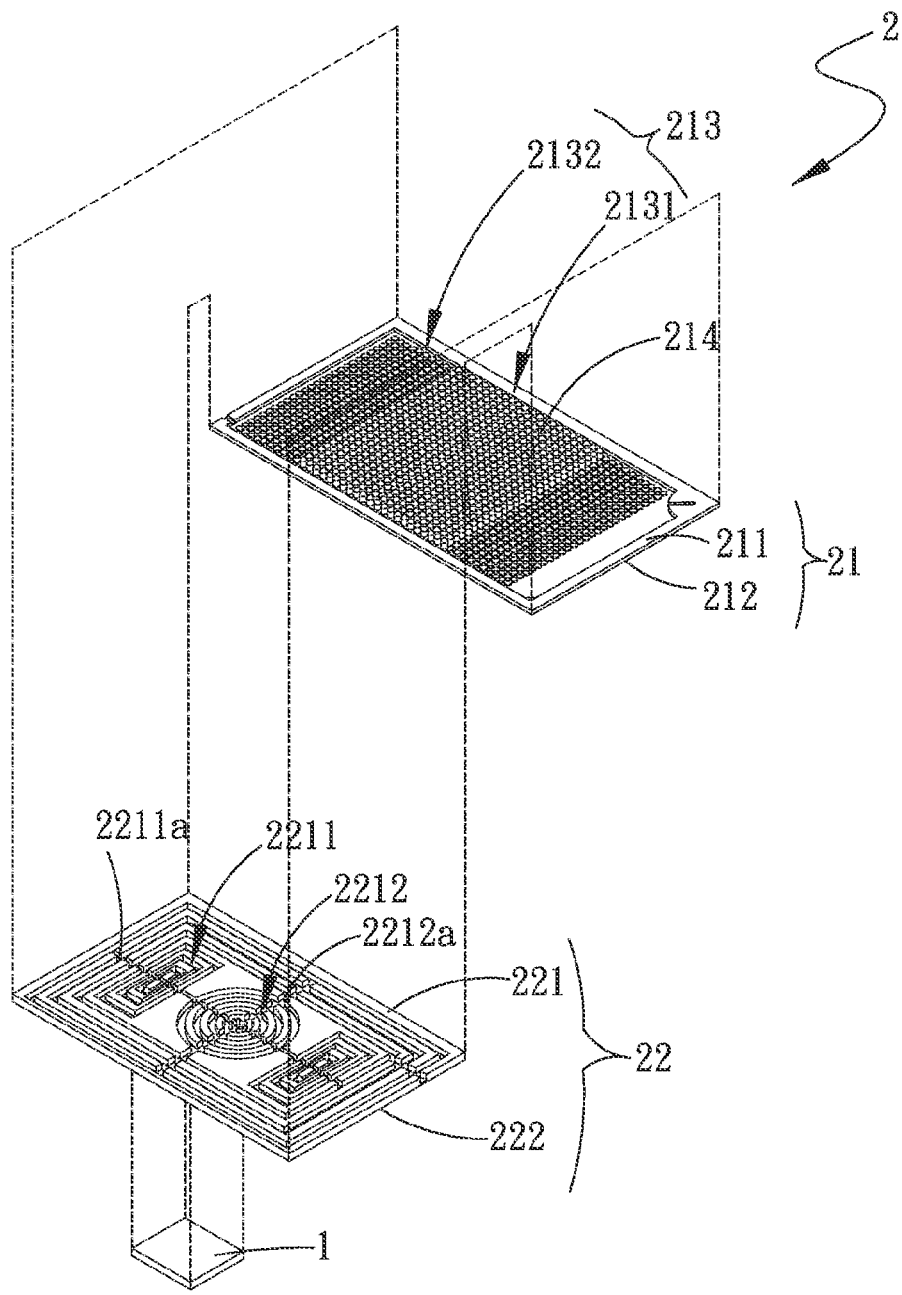
FIG. 1 is an exploded perspective view showing a first embodiment of the micro vapor chamber of the present invention.
Figure 2:
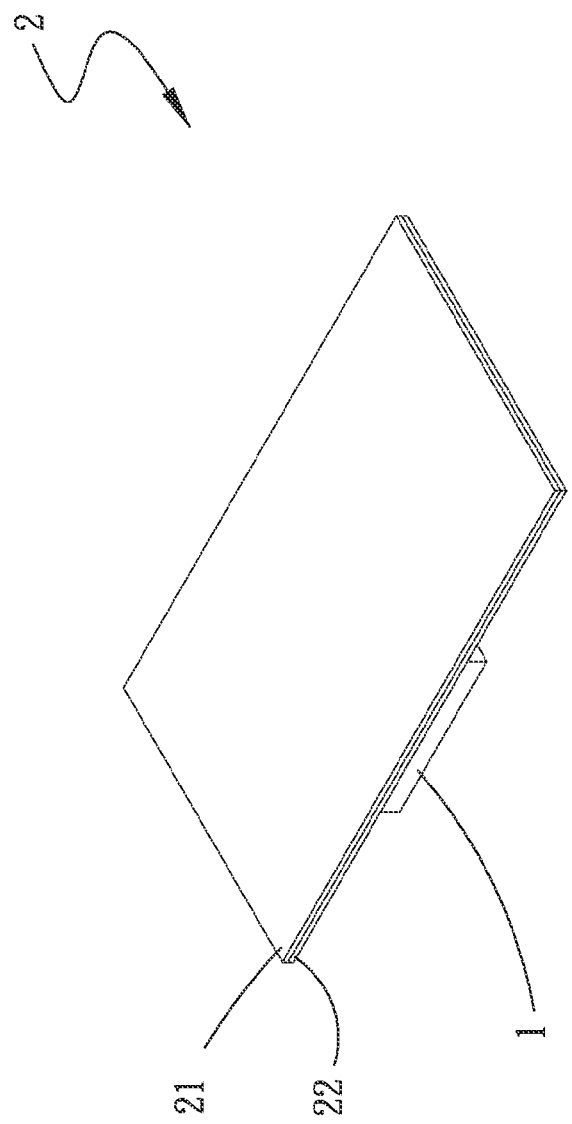
FIG. 2 is an assembled perspective view showing the first embodiment of the micro vapor chamber of the present invention.

The above objectives and structural and functional features of the present invention will be described in more detail with reference to preferred embodiments thereof shown in the accompanying drawings FIGS. 1, 2, 3 and 3a are an exploded perspective view, an assembled perspective view and two cross-sectional views of the first embodiment of the micro vapor chamber of the present invention respectively. As shown in these figures, the micro vapor chamber 2 of the present invention is configured to cooperate with at least one heat source 1. The micro vapor chamber 2 comprises a first plate 21 and a second plate 22.

The first plate 21 has a first side surface 211 and a second side surface 212. The first side surface 211 has at least one condensing region 213. The condensing region 213 has a plurality of protrusions 214. The protrusions 214 may have different diameters. As shown in FIG. 3a, the distal end of each protrusion 214 may be formed into a sharp end to facilitate the dripping of condensed working fluid. Each of the protrusions 214 is a copper post.

The condensing region 213 further has at least one first condensing portion 2131 and at least one second condensing portion 2132. The first condensing portion 2131 and the second condensing portion 2132 are constituted of the protrusions 214. The second condensing portions 2132 are provided on both sides of the first condensing portion 2131. The height of the protrusion 214 in the second condensing portion 2132 gradually increases toward the first condensing portion 2131, which means the height of the protrusion 214 in the first condensing portion 2131 is larger than that of the protrusion 214 in the second condensing portion 2132.

As best seen in FIGS. 3 and 3A, the second plate 22 has a third side surface 221 and a fourth side surface 222. The third side surface 221 is located to cover the first side surface 211. The third side surface 221 has a plurality of liquid-collecting regions 2211 and at least one evaporating region 2212. The fourth side surface 222 is adhered to the heat source 1. The liquid-collecting regions 2211 and the evaporating region 2212 have a plurality of channels 2211a and 2212a. The liquid-collecting regions 2211 are located outside the evaporating region 2212. The evaporating region and the liquid collecting regions have a plurality of unevenly spaced protrusions extending from third side surface 221 and having uniform upper flat free end surfaces. The protrusions in the evaporating region and liquid collecting regions define a plurality of channels therebetween, each protrusion abutting two corresponding channels.

Figure 4:
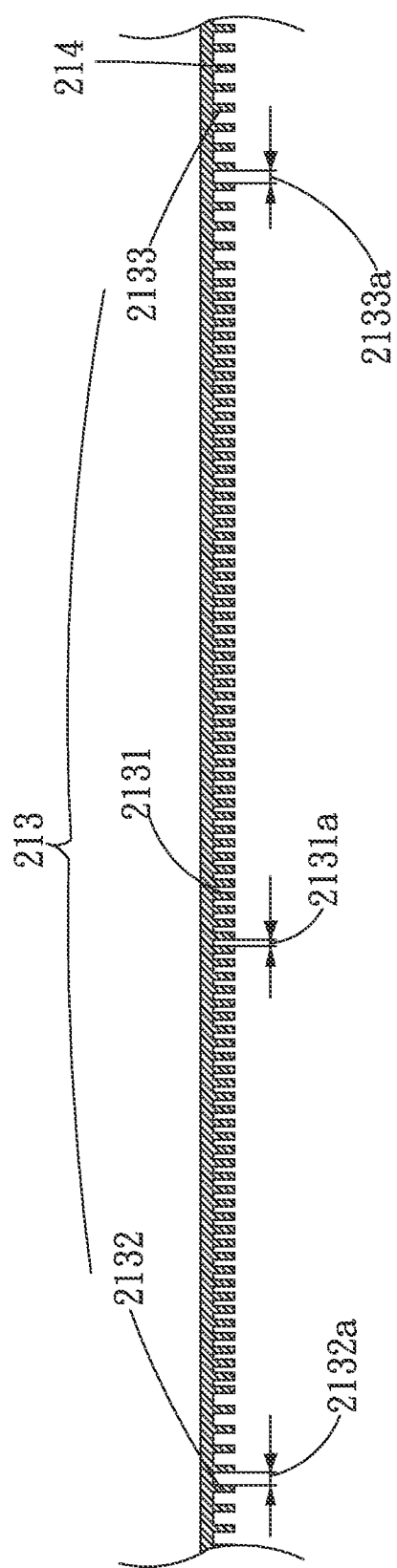
FIG. 4 is a cross-sectional view showing a first plate according to a second embodiment of the micro vapor chamber of the present invention.

Please refer to FIG. 4, which is a cross-sectional view showing the first plate according to the second embodiment of the micro vapor chamber of the present invention. As shown in this figure, a portion of the structure of the second embodiment is substantially the same as the first embodiment, and thus the repeated description is omitted for clarity. The difference between the second embodiment and the first embodiment lies in that: the condensing region 213 further has a first condensing portion 2131, a second condensing portion 2132 and a third condensing portion 2133. The second condensing portion 2132 and the third condensing portion 2133 are located on both sides of the first condensing portion 2131. The first condensing portion 2131, the second condensing portion 2132 and the third condensing portion 2133 are defined by the plurality of protrusions 214. The pitch 2131a among the protrusions 214 in the first condensing portion 2131 is smaller than the pitch 2132a among the protrusions 214 in the second condensing portion 2132 and the pitch 2133a among the protrusions 214 in the third condensing portion 2133.

Figure 5:
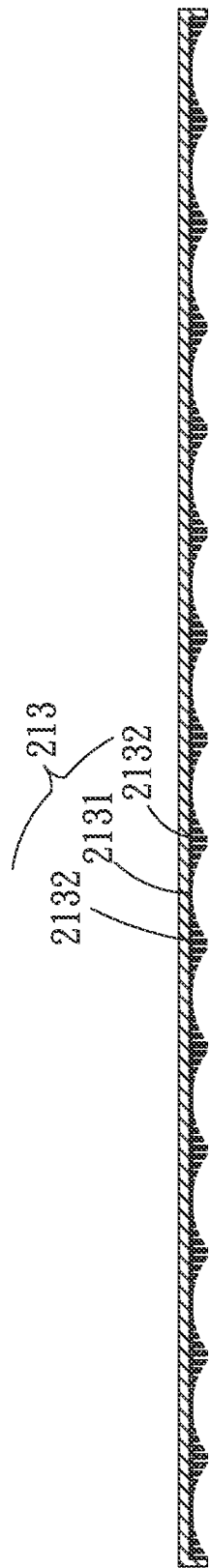
FIG. 5 is a cross-sectional view showing a first plate according to a third embodiment of the micro vapor chamber of the present invention.

Please refer to FIG. 5, which is a cross-sectional view showing the first plate according to the third embodiment of the micro vapor chamber of the present invention. As shown in this figure, a portion of the structure of the third embodiment is substantially the same as the first embodiment, and thus the repeated description is omitted for clarity. The difference between the third embodiment and the first embodiment lies in that: the condensing region 213 further has at least one first condensing portion 2131 and at least one second condensing portion 2132. The first condensing portion 2131 and the second condensing portion 2132 are constituted of the plurality of protrusions 214. The second condensing portions 2132 are provided on both sides of the first condensing portion 2131. The height of the protrusion 214 in the second condensing portion 2132 gradually decreases toward the first condensing portion 2131, which means the height of the protrusion 214 in the first condensing portion 2131 is smaller than the height of the protrusion 214 in the second condensing portion 2132. Each of the protrusions 214 is a body made of sintered powder.

Figure 6:
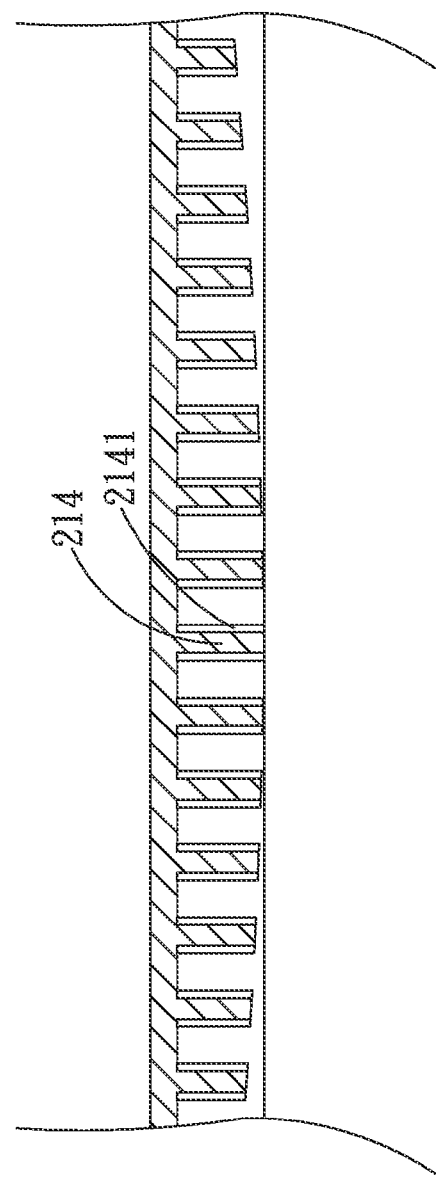
FIG. 6 is a cross-sectional view showing a first plate according to a fourth embodiment of the micro vapor chamber of the present invention.

Please refer to FIG. 6, which is a cross-sectional view showing the first plate according to the fourth embodiment of the micro vapor chamber of the present invention. As shown in this figure, a portion of the structure of the fourth embodiment is substantially the same as the first embodiment, and thus the repeated description is omitted for clarity. The difference between the fourth embodiment and the first embodiment lies in that: each of the protrusions 214 is a copper post externally having at least one groove 2141.

Figure 7:
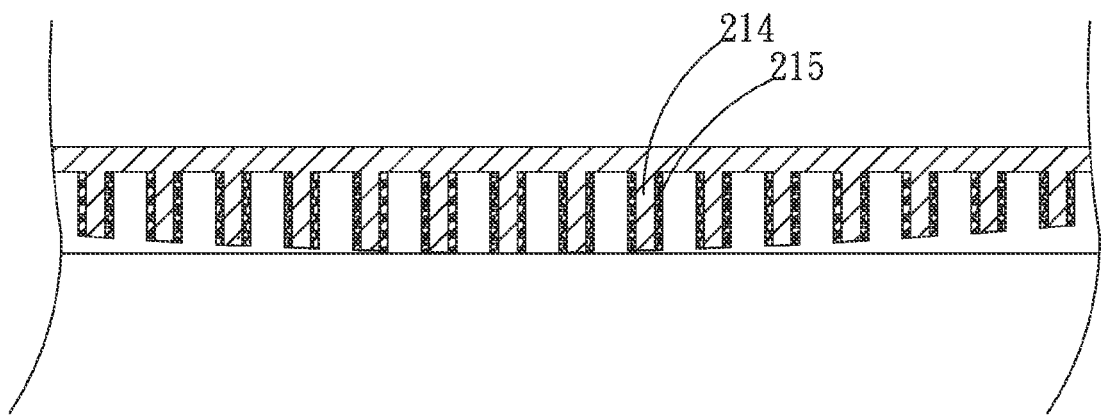
FIG. 7 is a cross-sectional view showing a first plate according to a fifth embodiment of the micro vapor chamber of the present invention.

Please refer to FIG. 7, which is a cross-sectional view showing the first plate according to the fifth embodiment of the micro vapor chamber of the present invention. As shown in this figure, a portion of the structure of the fifth embodiment is substantially the same as the first embodiment, and thus the repeated description is omitted for clarity. The difference between the fifth embodiment and the first embodiment lies in that: each of the protrusions 214 is a copper post externally having a ring 215 made of sintered powder.

Figure 8:
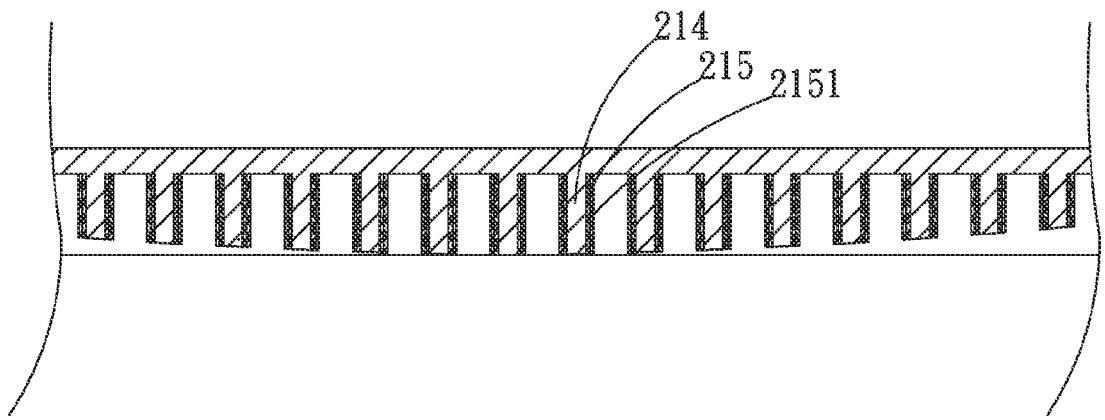
FIG. 8 is a cross-sectional view showing a first plate according to a sixth embodiment of the micro vapor chamber of the present invention.

Please refer to FIG. 8, which is a cross-sectional view showing the first plate according to the sixth embodiment of the micro vapor chamber of the present invention. As shown in this figure, a portion of the structure of the sixth embodiment is substantially the same as the first embodiment, and thus the repeated description is omitted for clarity. The difference between the sixth embodiment and the first embodiment lies in that: each of the protrusions 214 is a copper post externally having a ring 215 made of sintered powder. The ring 215 has at least one groove 2151.

Figure 9:
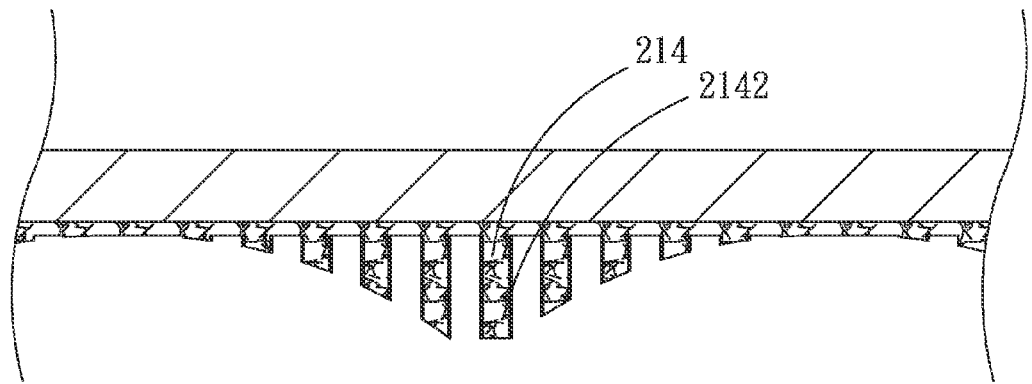
FIG. 9 is a cross-sectional view showing a first plate according to a seventh embodiment of the micro vapor chamber of the present invention.

Please refer to FIG. 9, which is a cross-sectional view showing the first plate according to the seventh embodiment of the micro vapor chamber of the present invention. As shown in this figure, a portion of the structure of the seventh embodiment is substantially the same as the first embodiment, and thus the repeated description is omitted for clarity.

The difference between the seventh embodiment and the first embodiment lies in that: each of the protrusions 214 is a body made of sintered powder externally having at least one groove 2142.

Figure 10:
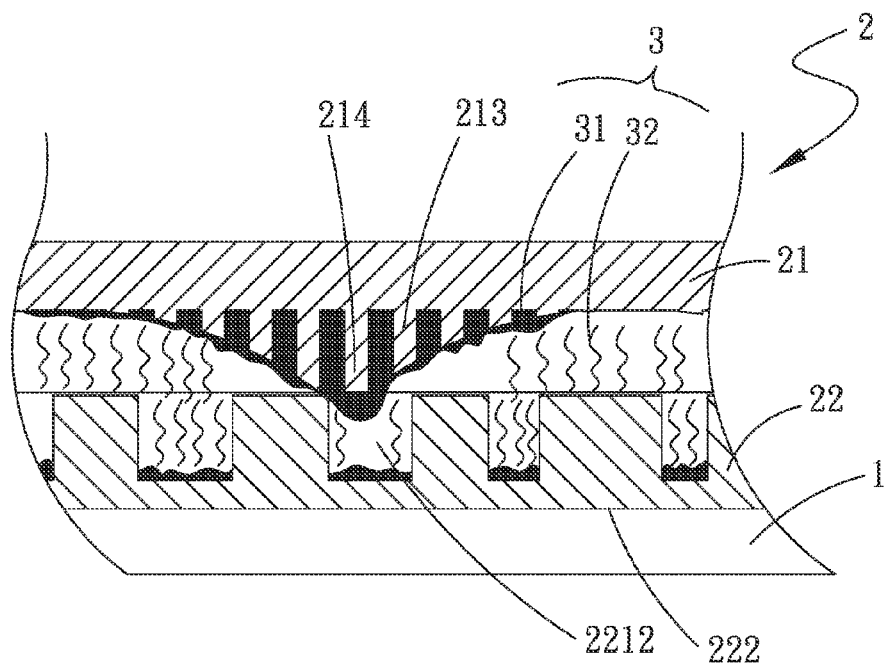
FIG. 10 is a schematic view showing the operation according to the micro vapor chamber of the present invention.

Please refer to FIG. 10, which is a schematic view showing the operation of the micro vapor chamber of the present invention. The fourth side surface 222 of the second plate 22 is brought into contact with at least one heat source 1 to absorb the heat generated by the heat source 1. The working fluid 3 in the evaporating region 2212 is heated to evaporate, so that the liquid-phase working fluid transforms into vapor-phase working fluid 32 to flow toward the first plate 21. The vapor-phase working fluid 32 is condensed in the condensing region 213 of the first plate 21 to return its liquid phase. The condensed working fluid 31 is quickly collected on the protrusions 214 in the condensing region 213 to flow back to the evaporating region 2212. By this structure, the liquid-vapor phase circulation of the working fluid 3 in the micro vapor chamber 2 can be accelerated to thereby improve the thermal-conducting efficiency greatly.

What is claimed is:

1. A micro vapor chamber, configured to cooperate with at least one heat source and including:
    a first plate having a first side surface and a second side surface, the first side surface having at least one condensing region, the condensing region having a plurality of first protrusions; and
    a second plate having a third side surface and a fourth side surface, the third side surface being located to cover the first side surface, the third side surface having a plurality of liquid-collecting regions and at least one evaporating region, the liquid collecting regions being located outside of the evaporating region, the evaporating region and the liquid collecting regions having a plurality of unevenly spaced second protrusions having uniform flat surfaces, the fourth side surface being adhered to the heat source;
    wherein the condensing region further has a central first condensing portion flanked by sections of a second condensing portion, located on both sides of the central first condensing portion;
    wherein the central first condensing portion and the sections of the second condensing portion are constituted of said first protrusions;
    wherein said first protrusions are separated and have a spaced rounded surface giving them a height and the height of the first protrusions in the sections of the second condensing portion gradually increases from outer regions toward the central first condensing portion;
    wherein the height of the first protrusions in the central first condensing portion is uniform and higher than any of the protrusions in the second condensing portion; and
    wherein the liquid-collecting regions and the evaporating region have a plurality of channels which are defined by a plurality of second protrusions, wherein one end of each second protrusion is a free end and each second protrusion corresponds to two channels.

2. The micro vapor chamber according to claim 1, wherein the condensing region further has a first condensing portion, a second condensing portion and a third condensing portion, the second condensing portion and the third condensing portion are provided on both sides of the first condensing portion, the first condensing portion, the second condensing portion and the third condensing portion are defined by the protrusions, a pitch among the protrusions in the first condensing portion is smaller than a pitch among the protrusions in the second condensing portion and a pitch among the protrusions in the third condensing portion.

3. The micro vapor chamber according to claim 1, wherein each of the protrusions is a copper post.

4. The micro vapor chamber according to claim 1, wherein each of the protrusions is a copper post externally having at least one groove.

5. The micro vapor chamber according to claim 1, wherein each of the protrusions is a copper post externally having a ring made of sintered powder.

6. The micro vapor chamber according to claim 1, wherein each of the protrusions is a copper post externally having a ring made of sintered powder, the ring made of sintered powder has at least one groove.

7. The micro vapor chamber according to claim 1, wherein each of the protrusions is a body made of sintered powder.

8. The micro vapor chamber according to claim 1, wherein each of the protrusions is a body made of sintered powder externally having at least one groove.

9. The micro vapor chamber according to claim 1, wherein the condensing region further has at least one first condensing portion and at least one second condensing portion, the first condensing portion and the second condensing portion are constituted of the protrusions, the second condensing portions are provided on both sides of the first condensing portion, a height of the protrusion in the second condensing portion gradually decreases toward the first condensing portion.

10. The micro vapor chamber according to claim 1, wherein the condensing region further has at least one first condensing portion and at least one second condensing portion, the first condensing portion and the second condensing portion are constituted of the protrusions, the second condensing portions are provided on both sides of the first condensing portion, a height of the protrusion in the second condensing portion gradually increases toward the first condensing portion.

* * * * *